United States Patent [19]

Vali et al.

[11] 4,146,801

[45] Mar. 27, 1979

[54] APPARATUS FOR PROTECTING POWER TRANSISTORS IN AN H CONFIGURATION POWER AMPLIFIER

[75] Inventors: Enn Vali, Burlington; William Dell, Hamilton; Stan Therrien, Burlington, all of Canada

[73] Assignee: Westinghouse Canada Limited, Hamilton, Canada

[21] Appl. No.: 914,552

[22] Filed: Jun. 12, 1978

[30] Foreign Application Priority Data

Nov. 21, 1977 [CA] Canada .................................. 291313

[51] Int. Cl.² ........................ G05B 9/02; H03K 17/60
[52] U.S. Cl. .................................... 307/254; 318/563; 318/681; 330/146; 330/298; 361/33
[58] Field of Search .................... 330/146, 207 P, 298; 318/563, 565, 566, 674, 677, 681; 361/23, 24, 30, 31, 33; 307/254

[56] References Cited

U.S. PATENT DOCUMENTS 3,413,520  11/1968  Westbrook .................... 361/31 X

*Primary Examiner*—James B. Mullins
*Attorney, Agent, or Firm*—Robert H. Fox; Edward H. Oldham

[57] ABSTRACT

This invention relates to the protection of power transistors in an H configuration power amplifier which drives a D.C. motor. When the amplifier is switched off, it may be possible for the base terminals of the transistors to be turned "on" which results in the transistors conducting. If two series transistors conduct, the resulting short circuit may damage or destroy the transistors. This invention provides an easy and economical apparatus for protecting the transistors in the power amplifier by grounding the base input terminals of the power transistors during all times when the transistors are switched "off."

5 Claims, 1 Drawing Figure

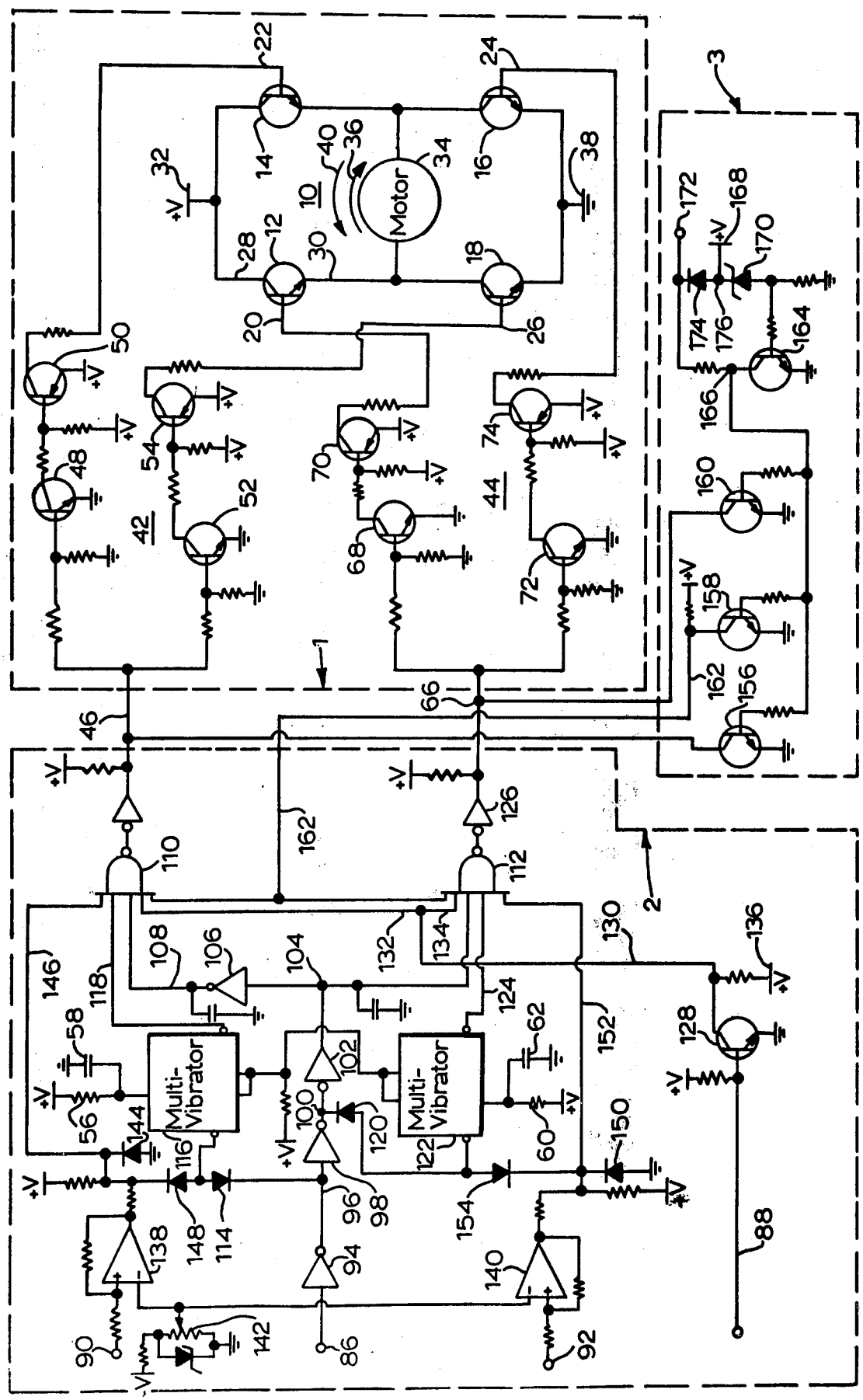

4,146,801

APPARATUS FOR PROTECTING POWER TRANSISTORS IN AN H CONFIGURATION POWER AMPLIFIER

BACKGROUND OF THE INVENTION

In the past, the H configuration power amplifier has consisted of four power transistors connected in a symmetrical fashion about a motor, The H configuration circuit may be described as being broken up into two parallel branches. Each branch consisting of a first and second power transistor connected in a serial arrangement so that the emitter of the first transistor is connected to the collector of the second transistor. The collectors of the first transistors in each branch are connected to the same power source while the emitters of the second transistors in each branch are connected to ground. At the emitter to collector junction between the first and second transistors of each branch the motor is connected.

The motor is controlled by introducing signals to the bases of the four power transistors so that, for example, when the first transistors of one branch is made to conduct simultaneously with the second transistor of the other branch. This provides for the flow of current from the power source through the first transistor of one branch, through the motor, and through the second transistor of the other branch to ground. To reverse the direction of rotation of the motor, the two transistors conducting would be switched off and the other two transistors would be turned on.

A problem that arises in the amplifier is that during the operation of the amplifier, the first and second transistors in the same branch may be allowed to conduct simultaneously. If the two transistors in the same branch conduct simultaneously, the power will flow from the source to ground through this branch and bypass the motor. When the motor is bypassed, the motor load which aids in limiting the current will be eliminated. The elimination of the motor load can result in the amplifier being damaged or the power transistors being destroyed.

The shorting of the two transistors in the same branch may occur during a continual change of motor direction, during the switch off of the system, or in the event of current surges in the system.

SUMMARY OF THE INVENTION

This invention relates to an apparatus for the protection of an H configuration power amplifier during the operation of the amplifier and during the amplifier switch-off.

During the amplifier switch-off, this invention provides for an inhibit signal to be sent to th bases of the four power transistors in the amplifier.The inhibit signal makes certain that the power transistors do not conduct. This ensures that no two power transistor connected in series may conduct due to any non-linearities at the time of switch-off. An apparatus which protects the amplifier during switch-off may be realized by using a switching device which, when the power to the amplifier is turned off, turns on causing the inhibit signals to be generated.

During the operation of the amplifier, this invention provides for the protection of the power transistors during the constant switching in direction of the D.C. motor. This is realized by providing an inhibit pulse which results in all the power transistors being inhibited for some finite time when the motor is reversing its rotation.

BRIEF DESCRIPTION OF THE DRAWINGS

The FIGURE shows a circuit diagram for the preferred embodiment which controls the operation of the motor as well as providing for the protection of the H configuration power amplifier.

DESCRIPTION OF THE PREFERRED EMBODIMENT

The FIGURE shows an H configuration power amplifier generally indicated at 10. Four power transistors 12, 14, 16, and 18 are shown having base bias terminals 20, 22, 24 and 26, respectively. When a signal is present at terminal 20 transistor 12 conducts allowing the passage of current from terminal 28 to terminal 30. When a signal is not present at terminal 20 transistor 12 does not conduct.

The H configuration of transistors is such that, when signals are present at terminals 20 and 24 simultaneously, transistors 12 and 16 conduct permitting the passage of current from source 32 through transistor 12, driving motor 34 in the direction shown by arrow 36, and through transistor 16 to grond 38. Similarily, to reverse the direction of the motor to that shown by arrow 40, terminals 22 and 26 will have a signal present. At no time should signals be present simultaneously at terminals 20 and 26 or at terminals 22 and 24, because this results in transistors 12 and 18 or 14 and 16 being shorted directly to ground 38. When the terminals are shorted in this fashion, the resistive load due to the motor is eliminated and the power transistors may be damaged to the point where they will no longer function.

The FIGURE shows the implementation of the amplifier using power transistors, but it should be understood that SCR's electromagnetic switches, or some other power switching devices may be used.

The circuit shown in the sole FIGURE, when implemented, controls the operation of the H configuration power amplifier 10. The FIGURE is shown broken into three stages by broken lines indicated at 1, 2, and 3. Stage 1 represents the output of the circuit which drives motor 34 through power amplifier 10. Stage 2 provides for current limiting control, drive inhibit control and control of which of the power transistors of amplifier 10 are to conduct. Stage 3 provides for the protection of the transistors during the shut-off of the motor system.

The output stage of the circuit, stage 1, is shown as having two sub-stages 42 and 44. Sub-stage 42 has two output terminals which are connected to bias base terminals 22 and 26 and cause transistors 14 and 18 to conduct when an output signal is present. Similarily, the output terminals of sub-stage 44 are connected to bias terminals 20 and 24 and cause transistors 12 and 16 to conduct only when an output signal is present.

It should be understood that the voltage entering sub-stage 42 by line 46 may be one of a possible two levels. One level causes the output voltages of section 42 to be of sufficient magnitude to cause transistors 14 and 18 to conduct. This may be termed as a "Hi" voltage state. The other level causes the output voltages of section 42 not to be of a sufficient magnitude so as to cause transistors 14 and 18 to conduct and may be termed as a "Lo" voltage state.

Transistors 48, 50, 52, and 54 are provided in order to amplify the drive signal to terminals 22 and 26. Line 46 is shown branching into two paths. One path is through transistors 48 and 50 to terminal 22. The other path is through transistors 52 and 54 to terminal 26. When line 46 is in a Hi voltage state transistors 48 and 50 conduct causing the voltage at terminal 22 to be in a Hi state and transistors 52 and 54 conduct causing the voltage at terminal 26 to be in a Hi state. This results in transistors 14 and 18 conducting. When line 46 is in a Lo voltage state transistors 48, 50, 52 and 54 do not conduct. This results in terminals 22 and 24 being in a Lo voltage state and power transistors 14 and 18 not conducting.

Similar to line 46, line 66 which enters sub-stage 44 is at one of two possible voltage levels. Line 66 branches into two paths. One path is through transistors 68 and 70 to terminal 20. The other path is via transistors 72 and 74 to terminal 24. When line 66 is at a Hi voltage state, transistors 68, 70, 72 and 74 function in a similar manner to transistors 48, 50, 52, and 54 which leaves the voltage at terminals 20 and 24 in a Hi state. This causes transistors 12 and 16 to conduct. When the voltage level on line 66 is in a Lo state, the voltage level of terminals 20 and 24 are in a Lo state and transistors 12 and 16 do not conduct. Transistors 68, 70, 72, and 74 are provided in order to amplify the drive signal to terminals 20 and 24.

It should be understood that in order to ensure that transistors 12 and 18 or 14 and 16 do not conduct simultaneously, the voltage level at lines 46 and 66 must never be in the Hi state simultaneously.

Stage 2 of the circuit shown within broken line 2 ensures that lines 46 and 66 are not in a Hi state simultaneously. Input terminal 86 controls the voltage levels of lines 46 and 66. Input terminal 88 provides for inhibiting the voltage level of lines 46 and 66. Terminals 90 and 92 provide for current limitation.

A drive signal enters through terminal 86. This signal may represent either a Hi voltage state or a Lo voltage state. When the drive signal is a Hi voltage state, line 46 is in a Hi state and line 66 is in a Lo state. When the signal at terminal 86 is indicative of a Lo voltage state, line 46 is in a Lo state and line 66 is in a Hi state.

For the purpose of explaining the operation of the circuit let us assume that initially line 46 is in a Lo state and line 66 is in a Hi state.

When the input drive signal 86 is at a Hi voltage state, the output 96 of inverter 94 is in a Lo state. The Lo state at 96 is inverted by inverter 98 to a Hi output state at 100. The Hi state at 100 is changed to a Lo state at 104 by inverter 102. The state at 104 is inverted by inverter 106 to a Hi state at 108. If all the other inputs to nand gates 110 and 112 other than lines 104 and 108 are assumed to be in a Hi state, then with the input of line 108 to nand gate 110 in a Hi state line 46 changes from a Lo state to a Hi state. Since the level of input line 104 is a Lo state, this input to nand gate 112 causes line 66 to go from a Hi state to a Lo state.

It should be understood that time delay introduced by inverter 106 would be in the order of a few nanoseconds, which may give rise to both lines 46 and 66 being in a Hi state if the delay of nand gate 112 was longer than the delay of nand gate 110. To overcome this situation, when line 96 is Lo, diode 114 conducts which results in monostable multivibrator 116 causing line 118 to go into a Lo state by sending out a Lo level voltage pulse of finite duration. The pulse duration should be long enough to allow line 66 to go into a Lo state before permitting nand gate 110 to conduct, for example, a pulse duration in the order of 25 microseconds. The pulse duration may be set by the values of resistor 56 and capacitor 58.

It should therefore be understood that when the drive input signal to terminal 86 goes into a Hi state, line 104 goes to a Lo state, line 118 goes temporarily to a Lo state, and line 108 goes to a Hi state. This results in line 66 going into a Lo state and line 46 going into a Hi state only after line 118 returns to a Hi state. It should be quite evident this circuit does not permit lines 46 and 66 being in a Hi state simultaneously.

Similarly, when the drive signal to terminal 86 changes to a Lo voltage state, line 96 changes to a Hi state due to inverter 94. Line 100 changes to a Lo state due to inverter 98 and line 104 changes to a Hi state due to inverter 102. Input line 108 to nand gate 110 will change to a Lo state due to inverter 106 and this causes line 46 to go into a Lo state. With line 100 in a Lo state, diode 120 conducts which gives rise to monostable multivibrater 122 causing line 124 to go temporarily into a Lo state. The pulse duration of monostable 122 may be determined by the value of resistor 60 and capacitor 62. When line 124 returns to a Hi state and since line 104 is in a Hi state, nand gate 112 and inverter 126 make line 66 change to a Hi state. In this instance, monostable 122 acts in a similar fashion to monostable 116 to ensure that both lines 46 and 66 are not at a Hi voltage state simultaneously.

Inverters 98 and 102 are provided to delay the change in signal eminating from input 86 permitting either of monostable 116 or 122 to inhibit nand gates 110 or 112 before the change is seen by either of these nand gates.

Terminal 88 is provided as a drive inhibit. When a Hi voltage state signal is received at terminal 88, transistor 128 conducts causing the transistor's collector to short to ground and change line 130 to a Lo voltage stage. When line 130 changes to a Lo state, the inputs 132 and 134 to nand gates 110 and 112, respectively, change to a Lo state which cause the voltage states of lines 46 and 66 to go a Lo state regardless of their prior states. Under a normal condition, the voltage signal to terminal 88 is a Lo state signal and hence transistor 128 does not conduct. When transistor 128 is not conducting, line 130 is at a Hi voltage state due to voltage source 136.

Negative motor currents are introduced at terminal 90 and are limited by comparator 138. Positive motor currents are introduced via terminal 92 and are limited by comparator 140. Current limit is set by variable resistor 142. When the input at terminal 90 becomes more negative than the current limit voltage set by variable resistor 142, the output of comparator 138 switches to a Lo state due to the conduction of diode 144. This leaves line 146 at a Lo state which prevents nand gate 110 from turning on and prevents any further increase in current through the motor. With line 146 going to a Lo state, diode 148 conducts producing a temporary inhibit signal on line 118 from monostable 116. When the current drops below the current limit figure, normal operation is resumed. Similarily when the input at terminal 92 goes more positive than the current limit voltage, the output of comparator 140 switches to a Lo state due to the conduction of diode 150. This causes input line 152 to nand gate 112 to be in a Lo state and inhibits nand gate 112 from turning on which prevents any further increase in motor current. Moreover, when line 152 changes to a Lo state, diode 154 conducts thereby causing monostable 122 to send a temporary inhibit signal along line 124.

Now referring to stage 3 of the circuit shown in the FIGURE, the collectors of three transistors 156, 158, and 160 are shown connected to lines 46, 162, and 66, respectively. When transistors 156, 158, and 160 conduct their collectors are shorted to ground thereby inhibiting lines 46 and 66 as well as nand gates 110 and 112. It should be understood that transistors 156, 158, and 160 are normally not conducting. When not conducting the collector of transistor 158 is in a Hi state while the state of the collectors of transistors 156 and 160 float with lines 46 and 66, respectively.

The bases of transistors 156, 158 and 160 are connected to the collector of transistor 164 at point 166. For transistors 156, 158, and 160 to be normally "off" (not conducting), transistor 164 should normally conduct. Voltage source 168 provides a voltage of sufficient magnitude to the base of transistor 164 via zener diode 170. This implies the voltage of source 168 has a higher voltage than the reverse breakdown voltage of zener diode 170.

Terminal 172 is connected to a voltage supply which is greater in magnitude than the voltage of source 168. When the system is turned off, the voltage at supply 168 drops. As the voltage at supply 168 drops below the reverse breakdown voltage of zener diode 170, zener diode 170 stops conducting in its reverse breakdown mode and the base of transistor 164 goes to ground potential. At this time, transistor 164 ceases to conduct and transistors 156, 158 and 160 conduct inhibiting all the power transistors 12, 14, 16 and 18 thus ensuring that transistors 12 and 18 or 14 and 16 do not conduct simultaneously.

A novel fail-safe circuit has been disclosed which controls changes in the direction of rotation of a D.C. motor. During a change in direction of motor rotation, power transistors which are responsible for controlling the current through the motor are not permitted by the circuit to be overloaded or to short the power supply to ground. Moreover, during the switching off of the motor, an inhibit signal inhibits current flowing through the power transistors.

The embodiments of the invention in which an exclusive property or privilege is claimed are defined as follows:

1. An apparatus for protecting power transistors in an H configuration amplifier which controls current through a D.C. motor comprising:
   a first input connected to a first control means and a second input connected to a second control means;
   said first control means controlling a first pair of power transistors which drive current through the motor in a first direction and upon occurrence of an inhibit signal at said first input said first control means inhibiting operation of said first pair of power transistors;
   said second control means controlling a second pair of power transistors which drive current through the motor in a second direction and upon occurrence of the inhibit signal at said second input said second control means inhibiting operation of said first pair of power transistors;
   a switching device and a control device, said switching device being open during operation of said motor;
   said switching device having a first output terminal and second output terminal connected to said first input and said second input, respectively;
   said control device including a voltage supply having a supply voltage and a reference means having a reference voltage;
   said supply voltage dropping when operation of said motor stops; and,
   said control device in response to said supply voltage dropping below that of said reference voltage causing said switch device to close and the inhibit signal to be produced at said first input and said second input.

2. The apparatus as claimed in claim 1 including a power transistor switching means comprising:
   a driving signal having a first signal condition and a second signal condition;
   said first signal condition causing an enable signal to be produced at said first input and the inhibit signal to be present at said second input;
   said second signal condition causing the enable signal to be produced at said second input and the inhibit signal to be present at said first input;
   said first control means causing said first pair of power transistors to conduct in response to the enable signal being produced at said first input;
   said second control means causing said second pair of power transistors to conduct in response to the enable signal being produced at said second input;
   a first gate means when in an enable state causing the enable signal to be produced at said first input and when in an inhibit state causing the inhibit signal to be produced at said first input;
   a second gate means when in the enable state causing the enable signal to be produced at said second input and when in the inhibit state causing the inhibit signal to be produced at the second output;
   first responsive means responsive to said driving signal causing said first gate means to be in the enable state and said second gate means to be in the inhibit state when said driving signal is the first signal condition, and said first responsive means causing the first gate means to be in the inhibit state and the second gate means to be in the enable state when the driving signal is the second signal condition;
   second responsive means triggering a first pulse means to place the first gate means in a temporarily inhibit state when said driving signal is in said first signal condition thereby ensuring the enable signal is not produced simultaneously at said first input and said second input; and,
   said second responsive means triggering a second pulse means to place the second gate means in a temporarily inhibit state when said drive signal is said second signal condition thereby ensuring the enable signal is not produced simultaneously at said first input and said second input.

3. The apparatus as claimed in claim 2, wherein:
   a positive and negative current limiting means is provided;
   said positive current limiting means sensing current through said motor and causing said first gate means into the inhibit state when the motor current exceeds a predetermined positive current value; and,
   said negative current limiting means sensing the current through the motor and causing said second gate means into the inhibit state when the motor current exceeds a predetermined negative current value.

4. The apparatus as claimed in claim 3 wherein:

said switching device has a third output causing said first gate means and said second gate means into the inhibit state when said switch device closes.

5. The apparatus as claimed in claim 3 wherein: said reference means comprises a zener diode having a reverse breakdown voltage; and,
said zener diode stops conducting in a reverse breakdown mode causing said switching device to close when said supply voltage drops below said reverse breakdown voltage.

* * * * *